US011688636B2

(12) United States Patent
Ghosh et al.

(10) Patent No.: US 11,688,636 B2
(45) Date of Patent: Jun. 27, 2023

(54) SPIN ON SCAFFOLD FILM FOR FORMING TOPVIA (71) Applicant: International Business Machines Corporation, Armonk, NY (US)

(72) Inventors: Somnath Ghosh, Clifton Park, NY (US); Karen Elizabeth Petrillo, Voorheesville, NY (US); Cody J. Murray, Burnt Hills, NY (US); Ekmini Anuja De Silva, Slingerlands, NY (US); Chi-Chun Liu, Altamont, NY (US); Dominik Metzler, Clifton Park, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 17/351,307

(22) Filed: Jun. 18, 2021

(65) Prior Publication Data
US 2022/0406657 A1   Dec. 22, 2022

(51) Int. Cl.
*H01L 21/768* (2006.01)
*H01L 21/3213* (2006.01)
*H01L 23/532* (2006.01)

(52) U.S. Cl.
CPC .. *H01L 21/76892* (2013.01); *H01L 21/32135* (2013.01); *H01L 21/32139* (2013.01); *H01L 21/76837* (2013.01); *H01L 23/53242* (2013.01)

(58) Field of Classification Search
CPC ......... H01L 21/76886; H01L 21/76892; H01L 21/76885; H01L 21/32139; H01L 21/32135
See application file for complete search history.

(56) References Cited

U.S. PATENT DOCUMENTS

| 6,133,163 | A | 10/2000 | Tanaka et al. |
|---|---|---|---|
| 9,553,088 | B1 * | 1/2017 | Basker ............ H01L 21/823468 |
| 9,761,489 | B2 | 9/2017 | Mebarki et al. |
| 9,773,676 | B2 | 9/2017 | Chang et al. |
| 9,793,163 | B2 | 10/2017 | Bristol et al. |
| 9,953,865 | B1 | 4/2018 | Briggs et al. |
| 10,388,510 | B2 | 8/2019 | De Silva et al. |
| 10,643,895 | B2 | 5/2020 | Mebarki et al. |
| 10,727,124 | B2 | 7/2020 | Clevenger et al. |
| 10,867,853 | B2 | 12/2020 | Lin et al. |

* cited by examiner

*Primary Examiner* — Thanhha S Pham
(74) *Attorney, Agent, or Firm* — Jeffrey M. Ingalls (57) ABSTRACT A method of manufacturing a semiconductor device is provided. The method includes forming a plurality of metal lines on substrate, forming a sacrificial dielectric material layer between the metal lines, forming a hardmask over at least one of the metal lines, etching at least one of the metal lines that is not covered by the hardmask, treating the sacrificial dielectric material layer to soften the layer. The method also includes removing the treated sacrificial dielectric material layer.

20 Claims, 8 Drawing Sheets

SPIN ON SCAFFOLD FILM FOR FORMING TOPVIA

BACKGROUND

The present disclosure relates to fabrication methods and resulting structures for semiconductor devices. More specifically, the present disclosure relates to fabrication methods and resulting structures including a spin on scaffold film for forming a topvia for a semiconductor device.

Traditional CMOS (Complementary Metal Oxide Semiconductor) fabrication techniques include process flows for constructing planar transistors. The density of planar transistors can be increased by decreasing the pitch between transistor gate elements. However, the ability to decrease gate pitch in planar transistors is limited by the required gate length and spacer thickness. Nonplanar transistor architectures, such as vertical field effect transistors (VFETs) and stacked nanotube field effect transistors (FETs), employ semiconductor channels with various gate-all-around (GAA) technologies to achieve increased device density, greater power efficiency, and some increased performance over lateral devices. Photolithography is the predominant technique used to pattern these ultrafine structures. Photolithography techniques involve the patterning of a thin photoresist layer and the transfer of the resulting photoresist pattern into a substrate.

SUMMARY

Embodiments of the present disclosure relate to a method of manufacturing a semiconductor device. The method includes forming a plurality of metal lines on substrate, forming a sacrificial dielectric material layer between the metal lines, forming a hardmask over at least one of the metal lines, etching at least one of the metal lines that is not covered by the hardmask, treating the sacrificial dielectric material layer to soften the layer. The method also includes removing the treated sacrificial dielectric material layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Exemplary embodiments will now be discussed in further detail with regard to semiconductor devices and methods of manufacturing same and, in particular, to methods of forming a top via in a back end metal wire for technology nodes of, for example, less than 5 nm. Some embodiments describe methods for etching back certain of the metal wires using a spin on glass (SOG) layer that is initially filled in areas between the previously formed metal lines to form a scaffold structure. The SOG layer may be an oxide-based material containing certain amounts of carbon and silicon therein. The method may include forming a hardmask layer over the SOG layer and metal lines, then forming a pillar on top of the hardmask layer, where the pillar itself functions as a hardmask for subsequent patterning of the actual hardmask layer. After forming the patterned hardmask layer, portions of the SOG layer (i.e., the scaffold) and metal lines are etched back so that the etched metal lines have a shorter height than the remaining metal lines that are covered by the hardmask layer. Then, the remaining material of the SOG layer is subjected to an ozone-based UV curing process (e.g., an advanced surface treatment and organic film removal (ASTR) process). In such an ASTR process, the ozone is used to remove the carbon that is included in the SOG layer to change the film properties of the SOG layer. By removing the carbon from the SOG layer, the layer becomes softer and may be more easily removed with a subsequent etching process (e.g., a dilute hydrofluoric acid (DHF) wet etching process). An effect of the present embodiments is that the SOG layer may serve as a scaffold between the metal wires and also provides protection to the sidewalls of the metal lines during the etching of same (e.g., the metal lines may be comprised of Ru. Therefore, the shape of the metal lines may not be significantly damaged due to the presence of the SOG layer scaffold. This may enable the back end metal wires to be formed with an improved shape, thereby allowing for device formation at a reduced pitch.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VTFETs, CMOSs, FETs, nanowire FETs, nanosheet FETs, SETs, and/or MOSFETs. By way of a non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Figure 1:
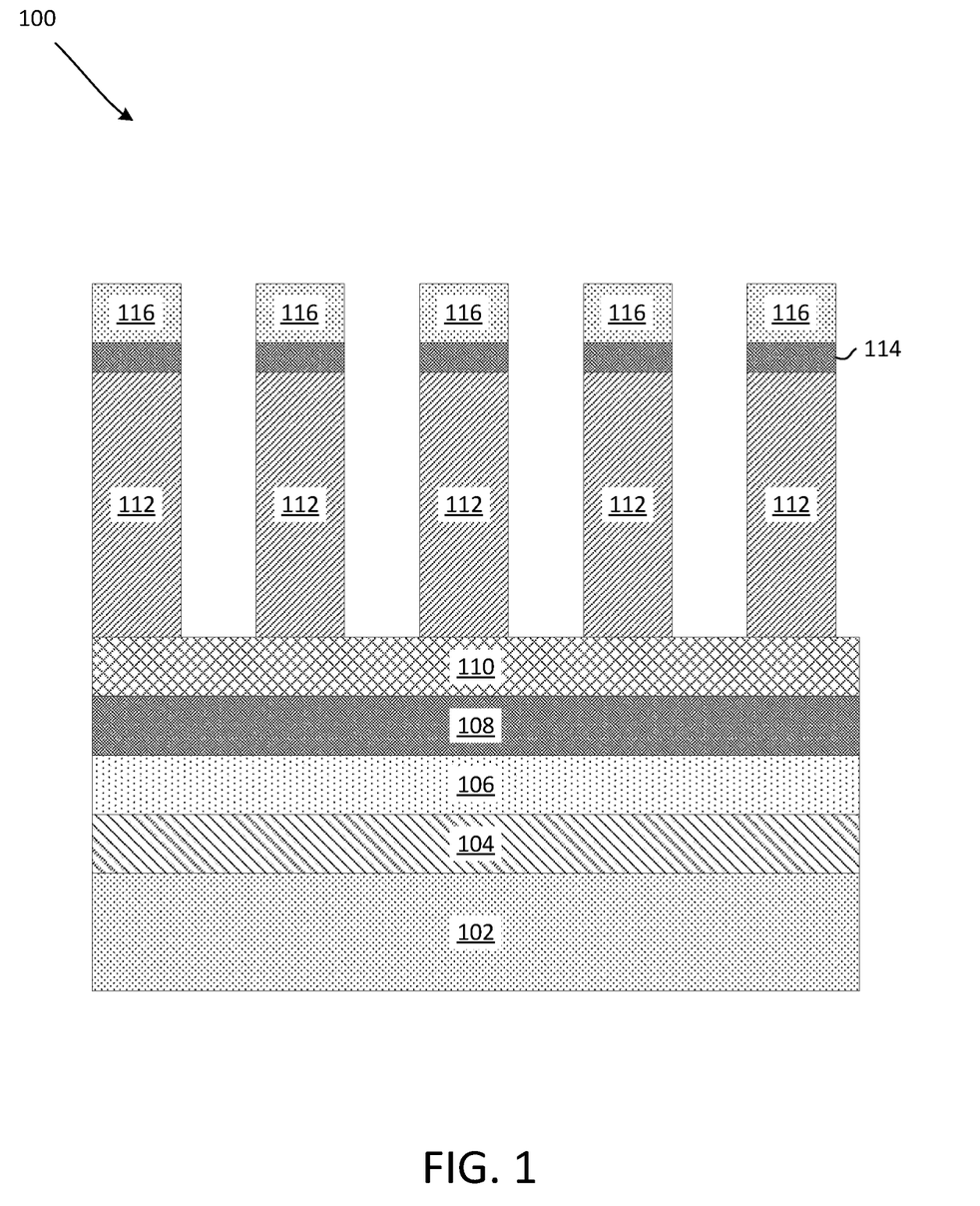
FIG. 1 is a cross-sectional view of a semiconductor device illustrating metal lines in a BEOL layer at an intermediate stage of the manufacturing process, according to embodiments.

Referring now to the drawings in which like numerals represent the same or similar elements and initially to FIG. 1, this figure is a cross-sectional view of a semiconductor device 100 illustrating back end metal wiring patterns formed in a back end of line (BEOL) process at an intermediated stage of the manufacturing process. As shown in FIG. 1, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. The substrate 102 may be comprised of any other suitable material(s) that those listed above. In certain embodiments, a Th oxide layer 104 is formed on the substrate 102. The Th oxide layer 104 may be, for example, 50 nm thick. In certain embodiments, a SiN layer 106 is formed on the Th oxide layer 104. The SiN layer 106 may be, for example, about 30 thick. In certain embodiments, a high density plasma (HDP) oxide layer 108 is formed on the SiN layer 106. The HDP oxide layer 108 may be, for example, about 50 nm thick. In certain embodiments, a TaN layer 110 is formed on the HDP oxide layer 108. The TaN may be, for example, about 2 nm thick. The layers include the substrate 102, the Th oxide layer 104, the SiN layer 106, the HDP oxide layer 108 and the TaN layer 110 may serve as a foundation upon which the back end metal lines are formed.

As also shown in FIG. 1, back end metal lines 112 are formed on the TaN layer 110. Although the process of forming the back end metal lines 112 is not shown in FIG. 1, it should be understood that these structures may be formed by any suitable combination of well know semiconductor processing steps described herein. For example, a uniform metal layer of, Ru for example, may be formed. Then a hardmask may be formed on the metal layer including, for example, a first hardmask layer 114 (e.g., a 4 nm thick layer of SiCN) and a second hardmask layer 116 (e.g., a 15 nm thick layer of tetraethyl orthosilicate (TEOS)). The first hardmask layer 114 and second hardmask layer 116 may then be patterned using a material removal process to form the hardmask that is used to pattern the back end metal lines 112 is a subsequent material removal process to arrive at the structures shown in FIG. 1.

In general, the back end of line (BEOL) is the second portion of IC fabrication where the individual devices (transistors, capacitors, resistors, etc.) get interconnected with wiring on the wafer. BEOL generally begins when the first layer of metal is deposited on the wafer. BEOL includes contacts, insulating layers (dielectrics), metal levels, and bonding sites for chip-to-package connections. Different layers of the BEOL may be designated as M1, M2, M3, M4 etc. based on their layer position relative to the wafer. In one example, the back end metal lines 112 may be formed in the M3 BEOL layer. However, it should be appreciated that in other examples, the metal lines may be formed in any suitable BEOL, middle end of line (MEOL), or front end of line (FEOL) layer.

Figure 2:
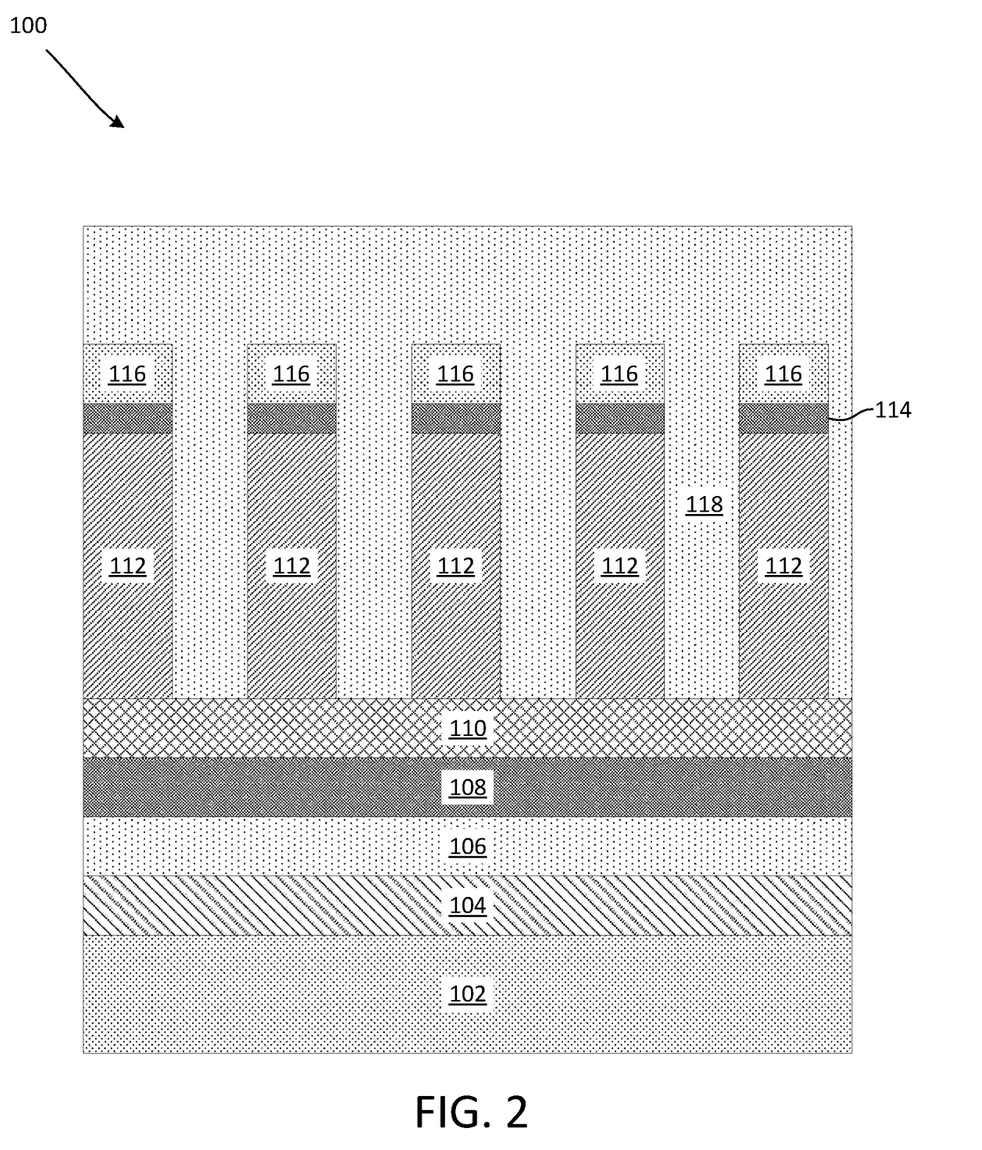
FIG. 2 is a cross-sectional view of the semiconductor device of FIG. 1 after additional processing operations, according to embodiments.

Referring now to FIG. 2, this figure is a cross-sectional view of the semiconductor device 100 of FIG. 1 at a subsequent stage of the manufacturing process, according to embodiments. As shown in FIG. 2, a spin on glass (SOG) layer 118 is applied to the semiconductor device 100 to form scaffolds between the various back end metal lines 112. In certain embodiments, the material of the SOG layer 118 is a flowable material than can fill the narrow gaps between the metal lines. The SOG layer 118 may comprise about 20% carbon content by weight. In examples where the metal material composition of the back end metal lines 112 is Ru, the material composition of the SOG layer 118 provides a good etching selectivity to the Ru metal in the back end metal lines 112. That is, the SOG layer 118 may be selectively etched with a relatively small amount of etching to the back end metal lines 112. In other words, the SOG layer 118 is designed with about 20% carbon content to provide a dry etch resistance for the metal etching step. In certain examples, the SOG layer 118 may include silicon in addition to carbon. The SOG layer 118 may be more generally referred to as a sacrificial dielectric material layer that forms a protective scaffold structure during the etching of the unmasked back end metal lines 112. In certain embodiments, a dry etching rate of the sacrificial dielectric material layer (or SOG layer 118) is at least substantially similar to a dry etching rate of the metal lines (or back end metal lines 112).

Figure 3:
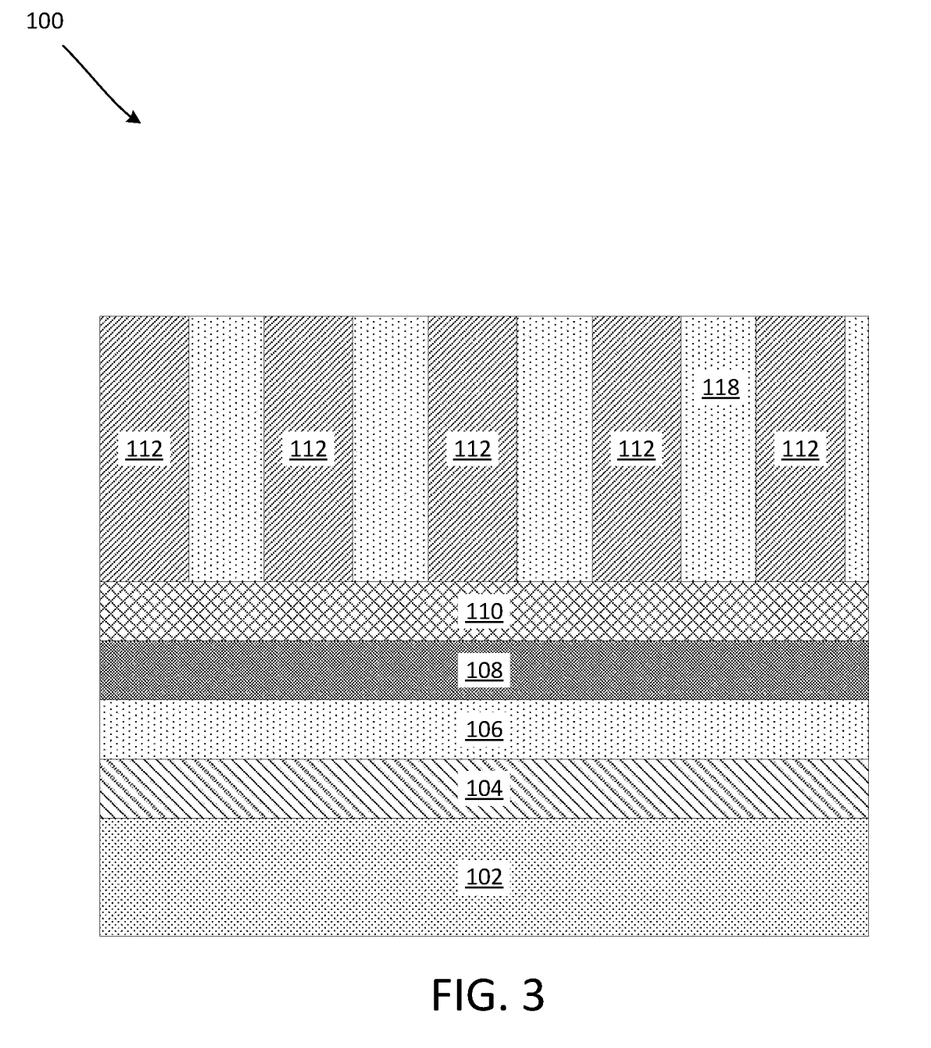
FIG. 3 is a cross-sectional view of the semiconductor device of FIG. 2 after additional processing operations, according to embodiments.

Referring now to FIG. 3, this figure is a cross-sectional view of the semiconductor device 100 of FIG. 2 at a subsequent stage of the manufacturing process, according to embodiments. As shown in FIG. 3, a material removal process is applied to the semiconductor device 100 to remove portions of the SOG layer 118 and the hardmask including the first hardmask layer 114 and the second hardmask layer 116. In certain examples, the material removal process may be chemical mechanical planarization (CMP) or any suitable etching process. Thus, after the removal of the first hardmask layer 114 and second hardmask layer 116, the top surfaces of the SOG layer 118 (i.e., the scaffold) and the back end metal lines 112 are coplanar.

Figure 4:
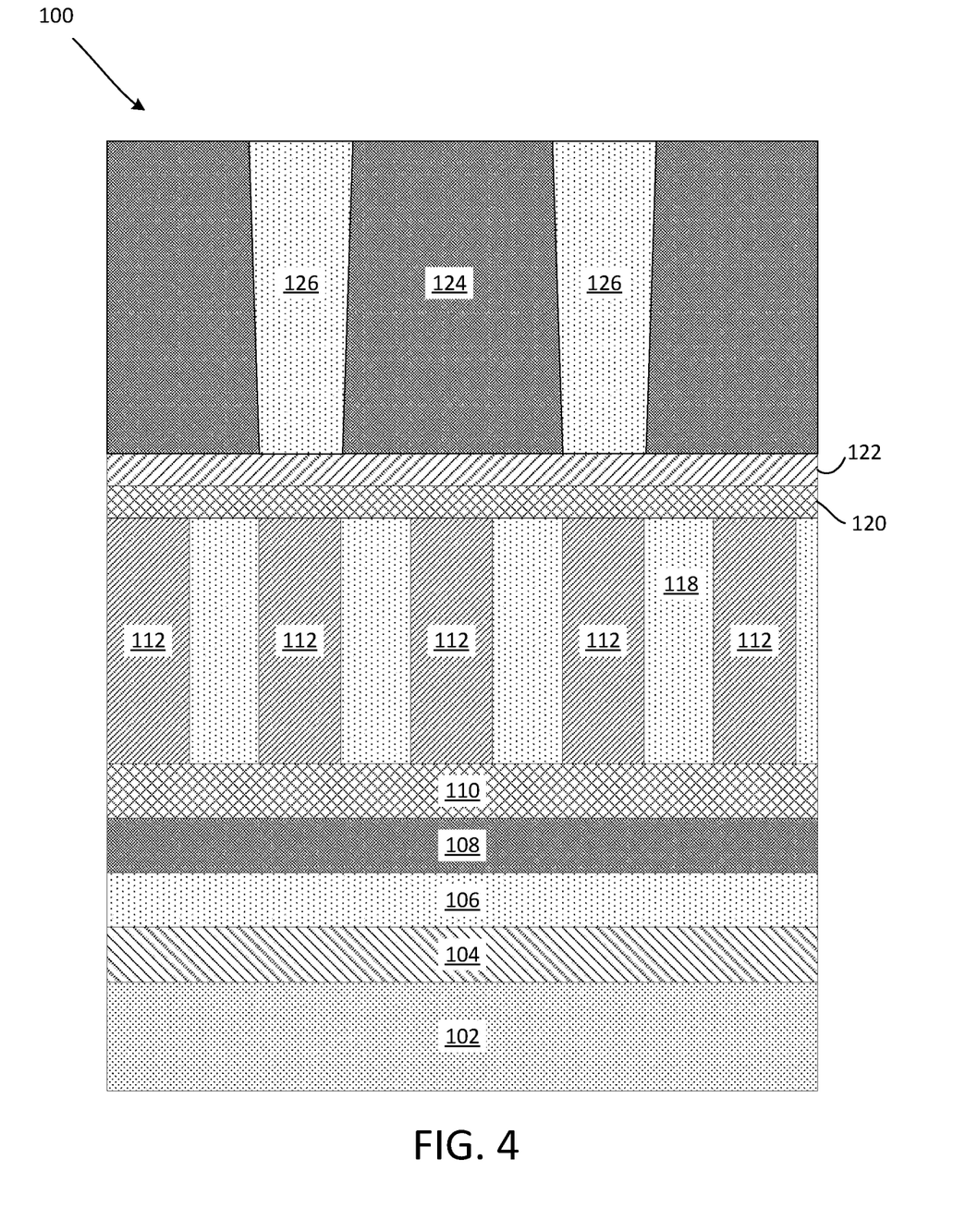
FIG. 4 is a cross-sectional view of the semiconductor device of FIG. 3 after additional processing operations, according to embodiments.

Referring now to FIG. 4, this figure is a cross-sectional view of the semiconductor device 100 of FIG. 3 at a subsequent stage of the manufacturing process, according to embodiments. As shown in FIG. 4, a third hardmask layer 120 and a fourth hardmask layer 122 are formed on the SOG layer 118 and the back end metal lines 112 across the entire surface of the wafer. In certain examples, the third hardmask layer 120 includes TiN and the fourth hardmask layer 122 includes SiCN. However, it should be appreciated that any other suitable number of hardmask layers or different compositions thereof may be used. Then, an organic planarization layer (OPL) 124 is formed on the fourth hardmask layer 122. Although not shown in FIG. 4, vias are first formed into the OPL 124 down to the level of the fourth hardmask layer 122. The vias are formed into a position corresponding with at least some of the back end metal lines 112. Then, as shown in FIG. 4, the vias in the OPL 124 are filled in with a spin on material layer 126. The spin on material layer 126 may be made of the same material as the SOG layer 118 or it may comprise any other suitable material.

Figure 5:
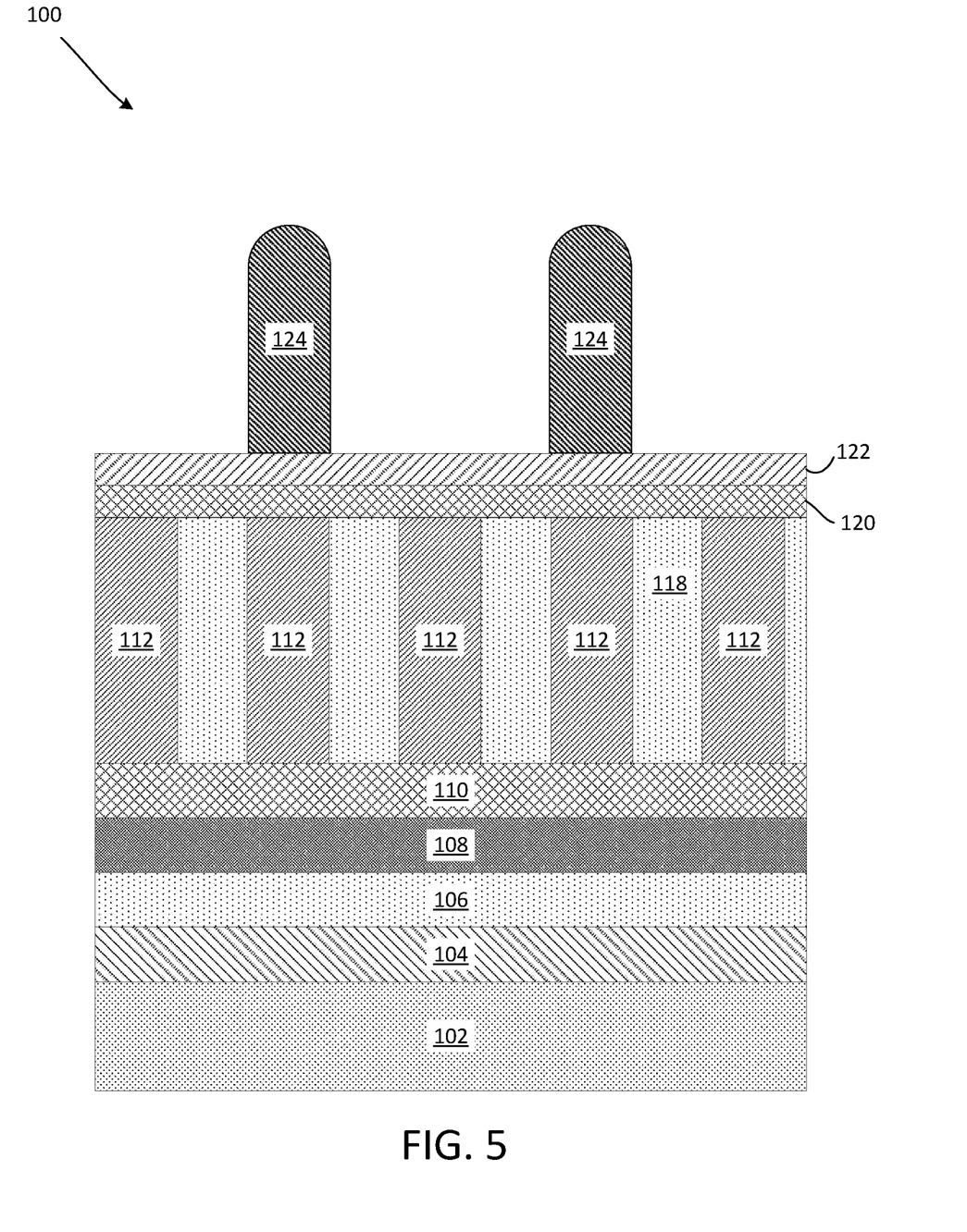
FIG. 5 is a cross-sectional view of the semiconductor device of FIG. 4 after additional processing operations, according to embodiments.

Referring now to FIG. 5, this figure is a cross-sectional view of the semiconductor device 100 of FIG. 4 at a subsequent stage of the manufacturing process, according to embodiments. As shown in FIG. 5, the OPL 124 is removed and a certain amount of material of the spin on material layer 126 is removed to result in a pillar shape of the spin on material layer 126. As discussed above, the pillars of the spin on material layer 126 are located above certain of the back end metal lines 112. In the example shown in FIG. 5, the pillars of the spin on material layer 126 are shown to be formed above every second one of the back end metal line 112 (every other one), however it should be understood that the pillars may be formed in any suitable pattern or number and they may also be formed over consecutive ones of the pillars of the spin on material layer 126.

Figure 6:
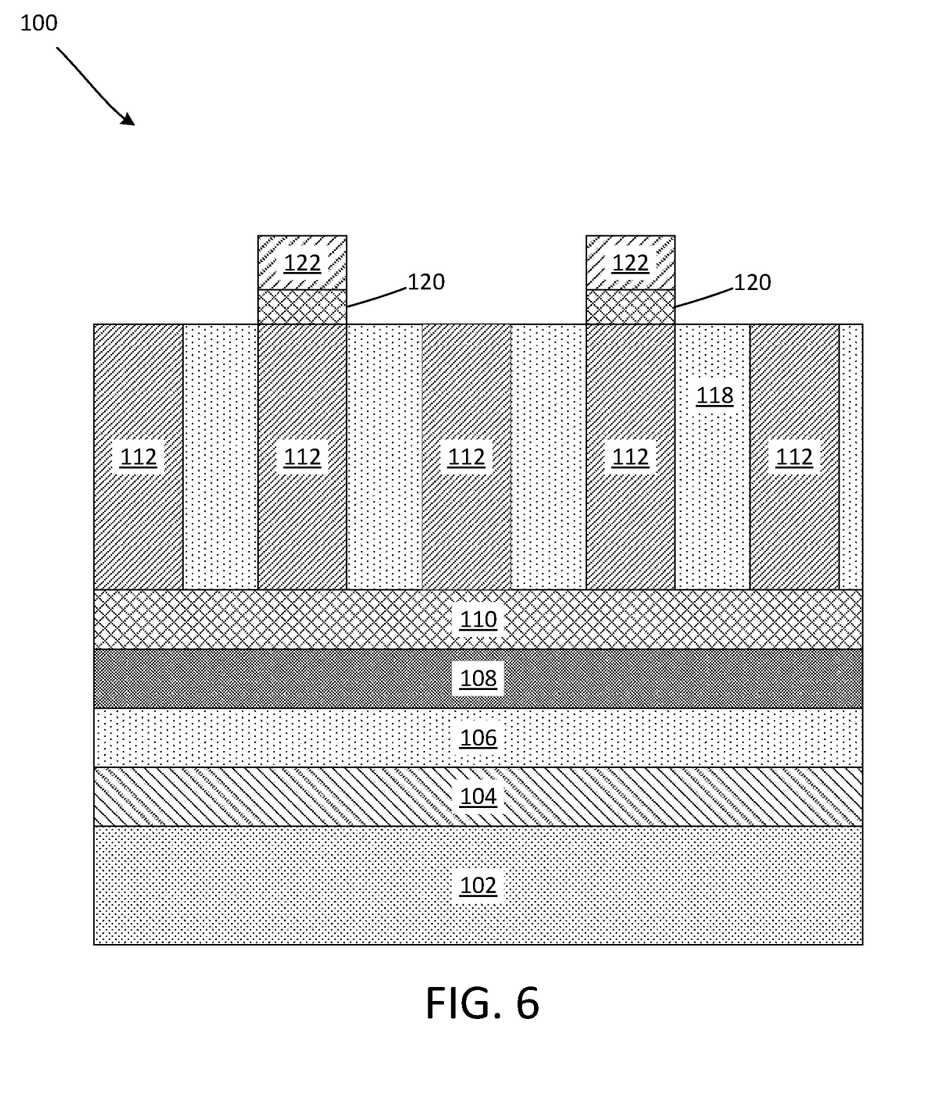
FIG. 6 is a cross-sectional view of the semiconductor device of FIG. 5 after additional processing operations, according to embodiments.

Referring now to FIG. 6, this figure is a cross-sectional view of the semiconductor device 100 of FIG. 5 at a subsequent stage of the manufacturing process, according to embodiments. As shown in FIG. 6, the pillars of the spin on material layer 126 are used as a mask to selectively remove portions (e.g., through any suitable etching technique) of the third hardmask layer 120 and the fourth hardmask layer 122. Thus, the third hardmask layer 120 and the fourth hardmask layer 122 remain only in areas that were covered by the spin on material layer 126. Then, as shown in FIG. 6, the spin on material layer 126 (i.e., the remaining pillar portions) is removed to expose the top surfaces of the fourth hardmask layer 122. Therefore, at this stage, the hardmask including the third hardmask layer 120 and the fourth hardmask layer 122 is ready to be used for selective etching of the back end metal lines 112 and the SOG layer 118.

Figure 7:
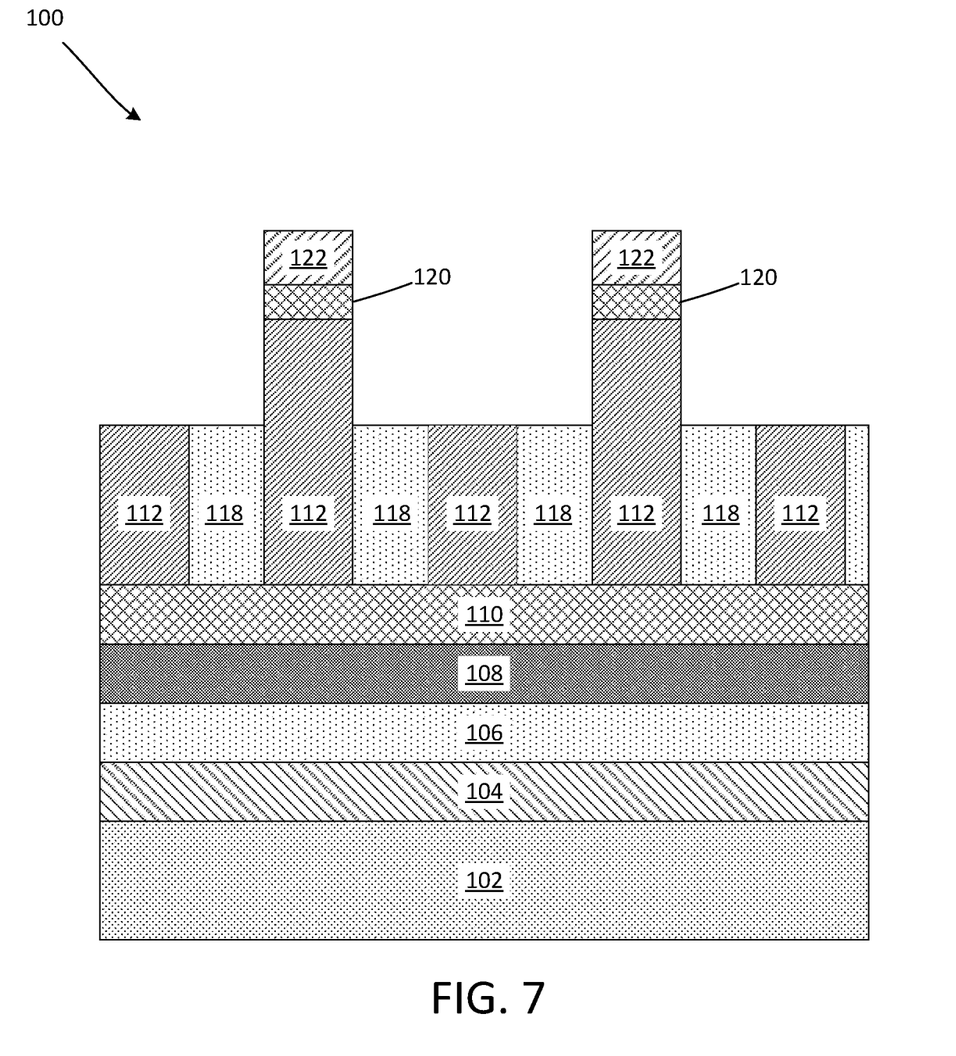
FIG. 7 is a cross-sectional view of the semiconductor device of FIG. 6 after additional processing operations, according to embodiments.

Referring now to FIG. 7, this figure is a cross-sectional view of the semiconductor device 100 of FIG. 6 at a subsequent stage of the manufacturing process, according to embodiments. As shown in FIG. 7, etching is performed to remove portions of the back end metal lines 112 that are not covered by the third hardmask layer 120 and the fourth hardmask layer 122. Prior to the removal of the remaining portions of the SOG layer 118, this layer is subjected to further processing to soften the layer prior to complete removal. In certain embodiments, the SOG layer 118 is subjected to an ozone-based UV curing process (e.g., an advanced surface treatment and organic film removal (ASTR) process). In such an ASTR process, the ozone is used to remove the carbon that is included in the SOG layer 118 to change the film properties of the SOG layer 118. By removing the carbon from the SOG layer 118, the layer becomes softer and may be more easily removed with a subsequent etching process (e.g., a dilute hydrofluoric acid (DHF) wet etching process). An effect of the present embodiments is that the SOG layer 118 may serve as a scaffold between the metal wires and also provides protection to the sidewalls of the metal lines during the etching of same (e.g., the metal lines may be comprised of Ru. Therefore, the shape of the back end metal lines 112 may not be significantly damaged due to the presence of the SOG layer 118 scaffold. Therefore, after the treatment of the SOG layer 118, it is softened to prepare it for wet etch removal. In FIG. 7, it is shown that the SOG layer 118 is etched down to a same depth as the depth of the metal lines 112, however it should be appreciated that in other examples the SOG layer 118 is etched to a lesser degree (i.e., so that the post etched SOG layer 118 would be higher than the back end metal lines 112) than the back end metal lines 112 in order to provide better protection to the sidewalls of the masked (i.e., and unetched) back end metal lines 112 under the first hardmask layer 120 and second hardmask layer 122.

Figure 8:
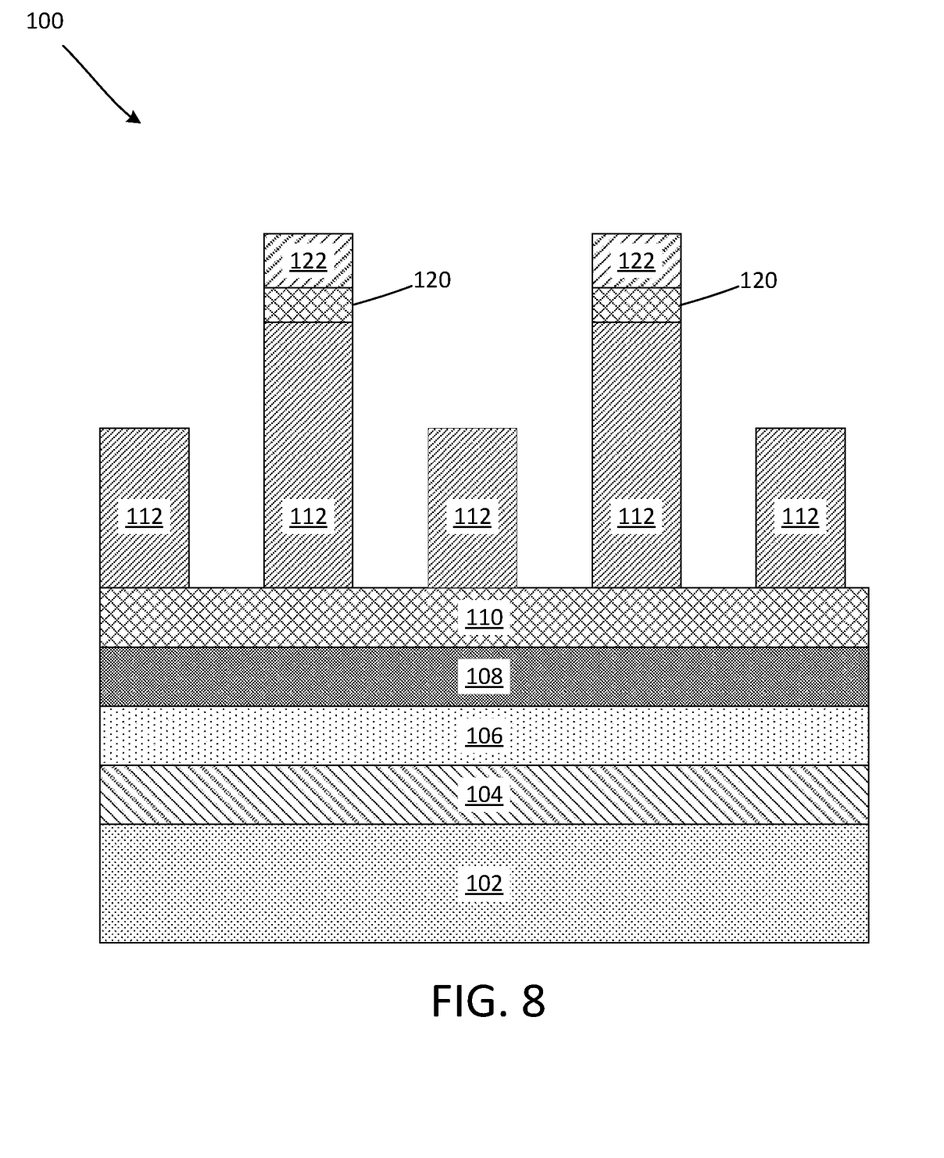
FIG. 8 is a cross-sectional view of the semiconductor device of FIG. 7 after additional processing operations, according to embodiments.

Referring now to FIG. 8, this figure is a cross-sectional view of the semiconductor device 100 of FIG. 7 at a subsequent stage of the manufacturing process, according to embodiments. As shown in FIG. 8, the SOG layer 118 has been removed by a wet etching process (e.g., using a DHF wet etching process or a SC-1 process). Therefore, certain of the back end metal lines 112 have been etched back, and other ones of the back end metal lines 112 that are covered by the third hardmask layer 120 and the fourth hardmask layer 122 are not significantly etched (either in the vertical or horizontal directions) due to the protective effects of the SOG layer 118 pillars (i.e., the SOG layer 118 protects the sidewalls of the masked back end metal lines 112 during the relatively aggressive metal etching process of the Ru material of the back end metal lines 112). This may enable the back end metal wires to be formed with an improved shape, thereby allowing for device formation at a reduced pitch. In certain embodiments, although not shown in FIG. 8, the semiconductor device may be further processed to include an operation of removal of the third hardmask layer 120 and fourth hardmask layer 122, filling in a second OPL layer (not shown) and forming additional metal contacts to connect to various ones of the back end metal lines 112. Thus, in the embodiments described above, by integrating the SOG material as a material that is resistant to Ru etching chemistry, the SOG layer 118 is able to protect the sidewalls of the masked back end metal lines 112 to preserve their shape. Moreover, by using, for example, an ozone based UV process (or ASTR process) to modify the physical properties of the SOG layer 118 (e.g., soften the layer), the layer may be easily removed with a subsequent wet etching process. In other embodiments, as an alternative to the ASTR process, the properties of the SOG layer 118 may be modified with a thermal treatment.

In certain embodiments, rather than using the SOG material for the SOG layer 118, the layer may comprise a spin on organic planarization layer material that is designed to withstand trench metal in CF4/Cl based etching chemistries.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for manufacturing a semiconductor device, the method comprising:
   forming a plurality of metal lines on substrate;
   forming a sacrificial dielectric material layer between the metal lines;
   forming a hardmask over at least one of the metal lines;
   etching at least one of the metal lines that is not covered by the hardmask;
   treating the sacrificial dielectric material layer to soften the layer; and
   removing the treated sacrificial dielectric material layer.

2. The method according to claim 1, wherein the sacrificial dielectric material layer is a spin on glass (SOG) layer.

3. The method according to claim 2, wherein the SOG layer includes about 15-25% carbon by weight.

4. The method according to claim 2, wherein the SOG layer includes, prior to treating, about 15-25% carbon by weight and about 25-35% silicon by weight.

5. The method according to claim 1, wherein a dry etching rate of the sacrificial dielectric material layer is at least substantially similar to a dry etching rate of the metal lines.

6. The method according to claim 1, wherein the sacrificial dielectric material layer comprises a spin on organic planarization layer material.

7. The method according to claim 1, further comprising:
   forming a second organic planarization layer on top of the metal lines; and
   forming vias in the second organic planarization layer above at least one of the metal lines.

8. The method according to claim 7, further comprising filling the vias with a dielectric material to form a pillar above the at least one of the metal lines.

9. The method according to claim 8, wherein the pillar comprises a spin on glass (SOG) material that is the same material as that of the sacrificial dielectric material layer.

10. The method according to claim 8, further comprising removing the second organic planarization layer.

11. The method according to claim 10, wherein forming the hardmask includes removing portions of the hardmask not corresponding to a location of the at least one metal line using the pillar as a mask.

12. The method according to claim 11, further comprising removing the pillar.

13. The method according to claim 1, wherein the metal lines comprise Ru.

14. The method according to claim 1, wherein the hardmask includes a first hardmask layer comprising TiN and a second hardmask layer comprising SiCN.

15. The method according to claim 1, wherein removing the treated sacrificial dielectric material layer includes wet etching with dilute hydrofluoric acid (DHF).

16. The method according to claim 1, wherein treating the sacrificial dielectric material layer includes removing a portion of carbon included therein.

17. The method according to claim 1, wherein treating the sacrificial dielectric material layer includes an ozone based UV curing process.

18. The method according to claim 1, wherein the plurality of metal lines are in a back end of line (BEOL) metal layer.

19. The method according to claim 1, wherein treating the sacrificial dielectric material layer includes performing an ASTR process.

20. The method according to claim 1, further comprising removing the hardmask.

* * * * *